United States Patent [19]
Kholodenko et al.

[11] Patent Number: 5,801,915
[45] Date of Patent: Sep. 1, 1998

[54] ELECTROSTATIC CHUCK HAVING A UNIDIRECTIONALLY CONDUCTING COUPLER LAYER

[75] Inventors: Arnold Kholodenko, San Francisco; Alexander M. Veytser, Mountain View; Shamouil Shamouilian, San Jose, all of Calif.

[73] Assignee: Applied Materials, Inc., Santa Clara, Calif.

[21] Appl. No.: 829,711

[22] Filed: Mar. 28, 1997

Related U.S. Application Data

[63] Continuation-in-part of Ser. No. 381,786, Jan. 31, 1995, which is a continuation-in-part of Ser. No. 189,562, Jan. 31, 1994, abandoned, and Ser. No. 410,449, Mar. 24, 1995, which is a continuation-in-part of Ser. No. 278,787, Jul. 19, 1994, abandoned.

[51] Int. Cl.$^6$ ............................................. H02N 13/00
[52] U.S. Cl. .............................. 361/234; 361/235; 279/128
[58] Field of Search ............................... 361/230, 233, 361/234, 235; 279/128

[56] References Cited

U.S. PATENT DOCUMENTS

| | | | |
|---|---|---|---|
| 3,983,401 | 9/1976 | Livesay | 250/492 A |
| 4,184,188 | 1/1980 | Briglia | 361/234 |
| 4,384,918 | 5/1983 | Abe | 156/643 |
| 4,399,016 | 8/1983 | Tsukada et al. | 204/192 R |

(List continued on next page.)

FOREIGN PATENT DOCUMENTS

| | | |
|---|---|---|
| 0171011 | 2/1986 | European Pat. Off. . |
| 0452222 | 10/1991 | European Pat. Off. . |
| 0473930 | 3/1992 | European Pat. Off. . |
| 0512936 | 4/1992 | European Pat. Off. . |
| 0552877 | 1/1993 | European Pat. Off. . |
| 61-56842 | 3/1986 | Japan . |
| 63-031732 | 2/1988 | Japan . |
| 1-298721 | 12/1989 | Japan . |
| 2-27748 | 1/1990 | Japan . |
| 3286834 | 12/1991 | Japan . |
| 3286835 | 12/1991 | Japan . |
| 5-200640 | 3/1993 | Japan . |
| 5069489 | 3/1993 | Japan . |
| 6-34283 | 12/1994 | Japan . |

OTHER PUBLICATIONS

Klein, Allen J., "Curing Techniques for Composites," *Advanced Composites*, Mar./Apr. 1988, pp. 32–44.

Nakasuji, Mamoru, et al., "Low Voltage and High Speed Operating Electrostatic Wafer Chuck Using Sputtered Tantalum Oxide Membrane," *J. Vac. Sci. Technol A*, vol. 12, No. 5, Sep./Oct. 1994, pp. 2834–2839.

(List continued on next page.)

*Primary Examiner*—Fritz Fleming
*Attorney, Agent, or Firm*—Ashok K. Janah; James C. Wilson

[57] ABSTRACT

An electrostatic chuck (20) for holding a substrate (45) in a process chamber (80) having a voltage supply terminal (65) for charging the chuck (20). The chuck includes an electrostatic member (25) comprising at least one electrode (30), an electrically insulated holding surface (40) for holding a substrate (45) thereon, and an electrical contact surface (48) for providing charge to the electrode. A unidirectionally conducting coupler layer (70) electrically couples the contact surface (48) of the electrostatic member to the voltage supply terminal to conduct charge substantially only in a single direction from the terminal to the contact surface. Preferably, an electrical connector (50) having a junction surface (55) bonded to the contact surface (55) of the electrode, and a terminal surface (60) for electrically contacting the voltage supply terminal (65), is used to electrically couple the unidirectionally conducting coupler layer (70) to the voltage supply terminal (65).

14 Claims, 4 Drawing Sheets

U.S. PATENT DOCUMENTS

| | | | |
|---|---|---|---|
| 4,480,284 | 10/1984 | Tojo et al. | 361/234 |
| 4,502,094 | 2/1985 | Lewin et al. | 361/234 |
| 4,520,421 | 5/1985 | Sakitani et al. | 361/234 |
| 4,565,601 | 1/1986 | Kakehi et al. | 156/643 |
| 4,645,218 | 2/1987 | Ooshio et al. | 279/1 M |
| 4,665,463 | 5/1987 | Ward et al. | 361/234 |
| 4,667,110 | 5/1987 | Kariya | 250/492.2 |
| 4,724,510 | 2/1988 | Wicker et al. | 361/234 |
| 4,771,730 | 9/1988 | Tezuka | 118/723 |
| 4,778,326 | 10/1988 | Althouse et al. | 414/786 |
| 4,832,781 | 5/1989 | Mears | 156/345 |
| 4,999,507 | 3/1991 | Clemens et al. | 250/492.2 |
| 5,049,421 | 9/1991 | Kosh | 428/34.4 |
| 5,055,964 | 10/1991 | Logan et al. | 361/234 |
| 5,104,834 | 4/1992 | Watanabe et al. | 501/127 |
| 5,151,845 | 9/1992 | Watanabe et al. | 361/234 |
| 5,160,152 | 11/1992 | Toraguchi et al. | 279/128 |
| 5,166,856 | 11/1992 | Liporace et al. | 361/233 |
| 5,191,506 | 3/1993 | Logan et al. | 361/234 |
| 5,207,437 | 5/1993 | Barnes et al. | 279/128 |
| 5,213,349 | 5/1993 | Elliott | 279/128 |
| 5,250,137 | 10/1993 | Arami et al. | 156/345 |
| 5,255,153 | 10/1993 | Nozawa et al. | 361/234 |
| 5,270,266 | 12/1993 | Hirano et al. | 437/228 |
| 5,275,683 | 1/1994 | Arami et al. | 156/345 |
| 5,280,156 | 1/1994 | Niori et al. | 219/385 |
| 5,324,053 | 6/1994 | Kubota et al. | 279/128 |
| 5,338,827 | 8/1994 | Serafini et al. | 528/353 |
| 5,348,497 | 9/1994 | Nitescu | 439/824 |
| 5,377,071 | 12/1994 | Moslehi | 361/234 |
| 5,382,311 | 1/1995 | Ishikawa et al. | 156/345 |
| 5,452,177 | 9/1995 | Frutiger | 361/234 |
| 5,460,684 | 10/1995 | Saeki et al. | 156/345 |
| 5,528,451 | 6/1996 | Su | 361/234 |
| 5,548,470 | 8/1996 | Husain et al. | 361/234 |
| 5,671,116 | 9/1997 | Husain | 361/234 |

OTHER PUBLICATIONS

Watanabe, Toshiya, et al., "Electrostatic Force and Absorption Current of Alumina Electrostatic Chuck," *J. Appl. Phys.*, vol. 31, Pt. 1, No. 7, 1992, pp. 2145–2150.

"Data Sheet—Breathers and Bleeders," Data Sheet from Airtech International, Inc., Carson, California (1993).

"Kapton General Information," Technical Brochure from DuPont de Nemours Company, Wilmington, Delaware (1993).

"Kapton KJ," Technical Information from DuPont Films, no date provided.

"R/flex® 1100 High Temperature Materials," Data Sheet DS20903D, Rogers Corporation, Chandler, Arizona (1993).

IBM Technical Disclosure Bulletin, vol. 32, No. 5B, Oct. 1989, "Double–sided Electrostatic Chuck".

International Application entitled, "Electrostatic Chuck with conformal Insulator Film," Published under the Patent Cooperation Treaty(PCT) Publication No. WO 95/20838; International Publication Date: 3 Aug. 1995; International Application No. PCT/US95/01355.

U.S. Patent Application entitled, "Electrostatic Chuck with Erosion–Resistant Electrode Connection,"; filed Feb. 22, 1994; Serial No. 08/199,916; Inventors: Shamouilian, et al.; Attorney Docket No. 556-2 (10516-2).

U.S. Patent Application entitled, "Erosion Resistant Electrostatic Chuck"; filed Feb. 22, 1994; Serial No. 08/199,402; Inventors: Shamouilian, et al.; Attorney Docket No. 556 (10516-3).

U.S. Patent Application entitled, "Electrostatic Chuck with Improved Erosion Resistance"; filed Mar. 24, 1995; Serial No. 08/410,449; Inventors: Shamouilian, et al.; Attorney Docket No. 556.P2 (10516-1).

ELECTROSTATIC CHUCK HAVING A UNIDIRECTIONALLY CONDUCTING COUPLER LAYER

CROSS-REFERENCE

This application is a continuation-in-part of U.S. patent application Ser. No. 08/381,786, entitled "ELECTROSTATIC CHUCK WITH CONFORMAL INSULATOR FILM," filed on Jan. 31, 1995, by Shamouilian, et al., which is a continuation-in-part of U.S. patent application Ser. No. 08/189,562, entitled "ELECTROSTATIC CHUCK," filed Jan. 31, 1994, now abandoned, also by Shamouilian, et al., and is a continuation-in-part of U.S. patent application Ser. No. 08/410,449, entitled "ELECTROSTATIC CHUCK WITH IMPROVED EROSION RESISTANCE," filed on Mar. 24, 1995, by Shamouilian, et al., which is a continuation-in-part of U.S. patent application Ser. No. 08/278,787, entitled "ELECTROSTATIC CHUCK WITH EROSION RESISTANT ELECTRICAL CONNECTOR," filed Jul. 19, 1994, now abandoned, by Cameron, et al.—all of which are incorporated herein by reference.

BACKGROUND

This invention relates to electrostatic chucks used for holding substrates.

Electrostatic chucks are used to hold substrates, such as a silicon wafers, during processing of the substrate. A typical electrostatic chuck comprises an electrostatic member attached to a base that is capable of being secured to a support in a chamber. To use the chuck, a substrate is placed on the electrostatic member, and an electrode in the electrostatic member is electrically biased with respect to the substrate by an electrical voltage. Process gas is introduced into the process chamber, and in certain processes, a plasma is formed from the process gas. Opposing electrostatic charge accumulates in the electrostatic member and substrate, resulting in attractive electrostatic forces that electrostatically hold the substrate to the chuck.

The electrostatic member of the chuck typically comprises an insulator enclosing an electrode and having a connector strap connecting the electrode to a voltage supply terminal in the process chamber. Typically, the connector strap extends over the edge of the chuck and is exposed to the erosive environment in the chamber. The insulator covering the connector strap typically comprises an insulating polymer, such as polyimide, which has a limited lifetime in erosive environments, for example oxygen-containing plasma. In such erosive processes, the exposed insulator on the electrical connector strap rapidly erodes, and erosion through the insulator at even a single point can cause arcing between the electrode and plasma, requiring replacement of the entire chuck.

In one solution to this problem, described in commonly assigned U.S. patent application Ser. No. 08/333,455, entitled "EROSION RESISTANT ELECTROSTATIC CHUCK," filed on Nov. 2, 1994, by Yuh-Jia Su, which is incorporated herein by reference, a protective plug is used to cover the connector strap. However, the protective plug can also be eroded to form contaminants in the chamber. In another solution, described in commonly assigned U.S. patent application Ser. No. 08/410,449, entitled "ELECTROSTATIC CHUCK WITH IMPROVED EROSION RESISTANCE," filed on Mar. 24, 1995, by Shamouilian, et al., the connector strap is inserted through a hole in the base of the chuck so that the connector strap is covered and protected from the erosive environment by the overlying substrate. However, the connector strap is folded over to be inserted through the hole in the base, and the pressure exerted by the bent-over strap on the electrostatic member can cause delamination within the electrostatic member. Also, gaps between the connector strap and the hole in the base can allow process gas and plasma to contact and erode the connector strap.

In conventional electrostatic chucks, additional problems arise at the point of electrical contact of the connector strap of the chuck with the high voltage terminal in the chamber. A high voltage contact assembly typically comprising multiple components, including electrical contact discs for electrically connecting the connector strap to the voltage terminal, and washers for providing a seal between the contact disc and the terminal, is used to form the contact assembly. When the components of the high voltage assembly are not assembled properly, electrical charge can leak from these components to the surrounding electrically conducting base. Such charge leakage can cause variation of the electrostatic force used to hold the substrate resulting in movement or misalignment of the substrate in the chamber. Also, it is difficult to assemble the high voltage components which can be assembled only after the connector strap is positioned below the base of the chuck. Furthermore, the electrical contact discs and washers are precisely dimensioned to obtain good electrical contact and are consequently expensive to fabricate.

Another problem arises from the pressure exerted by the connector assembly against the relatively thin electrode layer. To achieve good electrical contact, the voltage terminal is firmly pressed against the exposed portion of the connector strap, and this strongly applied pressure wears out the thin exposed contact portion of the connector strap at the point of contact with the voltage supply terminal. Also, application of a strong pressure on the connector strap can cause the strap to fail at its bent-over portion. Alternatively, a weak pressure provides poor electrical contact that can cause the impedance of the connector strap to change and result in variable and non-uniform electrostatic chucking force.

Thus, it is desirable to have an electrostatic chuck with an electrical contact assembly that is directly connected to the electrode, exhibits reduced leakage or variability of charge flowing therethrough, and limits damage or delamination of the electrostatic member. It is further desirable for the chuck to be substantially resistant to erosion in corrosive gaseous environments. It is also desirable for the high voltage contact to be fabricated with the minimum of components and requiring minimum assembly. It is further desirable to have a high voltage contact that provides good electrical charge conductance without excessive dissipation of electrical charge to the surrounding chuck structure.

SUMMARY

The electrostatic chuck of the present invention satisfies these needs by providing reliable and good electrical connections between an electrode of an electrostatic chuck and a voltage supply terminal in a process chamber for charging the electrode. The chuck comprises an electrostatic member including (i) an electrode, (ii) an electrically insulated holding surface, and (iii) an electrical contact surface for conducting charge to the electrode. A unidirectionally conducting coupling layer is bonded to the contact surface to conduct a charge in substantially only a single direction from the voltage supply terminal to the contact surface to charge the electrode. The resultant chuck provides a secure and high conductance electrical connection and reduced leakage of charge through the surrounding chuck structure.

In another aspect, the present invention provides a method of fabricating an electrostatic chuck for holding a substrate in a process chamber having a voltage supply terminal for charging the chuck. The method comprises the steps of forming an electrostatic member comprising an electrode having an electrically insulated holding surface and an exposed electrical contact surface. A unidirectionally conducting coupler layer is bonded to the contact surface of the electrode to conduct a charge in substantially only a single direction from the voltage supply terminal to the contact surface to charge the electrode of the electrostatic member.

DRAWINGS

These and other features, aspects, and advantages of the present invention will become better understood with regard to the following description, appended claims, and accompanying drawings which illustrate examples of the invention, where:

DESCRIPTION

Figure 1:
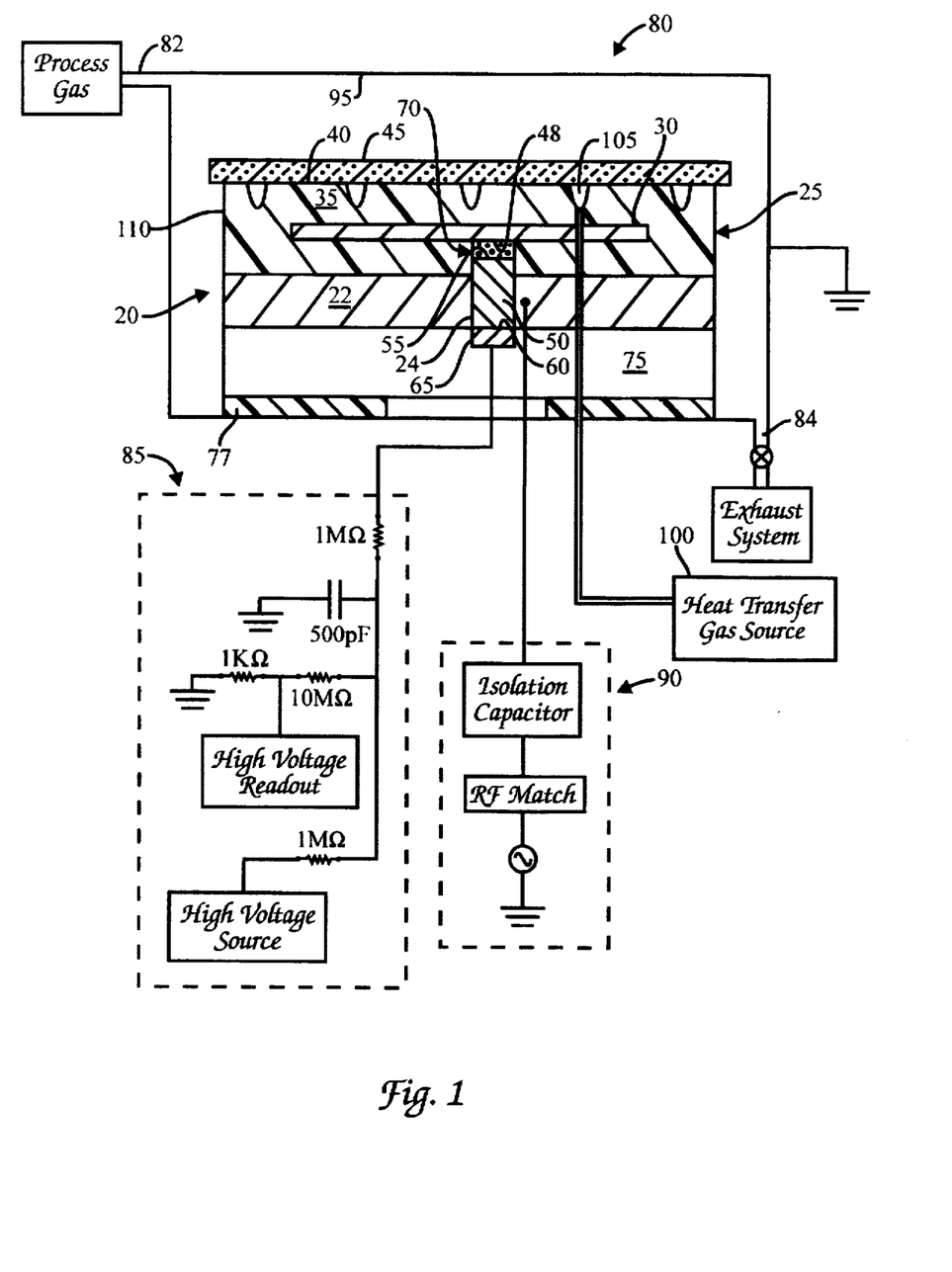
FIG. 1 is a partial sectional schematic view of a process chamber showing an electrostatic chuck according to the present invention.

FIG. 1 illustrates a version of an electrostatic chuck 20 according to the present invention. The electrostatic chuck 20 comprises a base 22 with a bore 24 therethrough, the base 22 suitable for supporting an electrostatic member 25. The electrostatic member 25 comprises (i) electrode 30, (ii) an electrically insulated holding surface 40 on the electrode for holding a substrate 45, and (ii) an electrical contact surface 48 for conducting charge to the electrode 30. Preferably, the contact surface 48 comprises an exposed portion of the electrode 30 without insulator thereon. An electrical connector 50 comprising a junction surface 55 capable of being bonded and electrically coupled to the exposed contact surface 48 of the electrode, and a terminal surface 60 for electrically connecting and mating the connector to a voltage supply terminal 65, extends through the bore 24 in the base 22. An unidirectionally conducting coupler layer 70 electrically couples and bonds the voltage supply terminal 65, via the electrical connector 50, to the contact surface 48 of the electrostatic member 25 to conduct electrical currents substantially only in a single and unitary direction from the voltage supply terminal 65 to the electrode of the electrostatic member 25. The unidirectionally conducting coupling layer 70 allows current to flow directly to the electrode in a singular direction which is orthogonal and transverse to the plane of the conducting layer 70, thereby minimizing dissipation of current through the surrounding electrically conducting base 24.

During its use, the electrostatic chuck 20 is secured on a support 75 in a process chamber 80. The support 75 comprises an insulator flange 77 disposed between the support 75 and the chamber to electrically isolate the support 75. The process chamber 80 forms an enclosure suitable for processing a substrate 45, and typically includes a gas inlet 82 for introducing a plasma-forming process gas into the chamber, and a throttled exhaust 84 for exhausting gaseous byproducts from the chamber 80. The particular embodiment of the process chamber 80 shown in FIG. 1 is suitable for plasma processing of a substrate 45, the plasma being a primary source of erosion of the chuck 20. However, the chuck 20 can be used in other process chambers, and non-plasma processes, without deviating from the scope of the present invention.

When the chuck 20 is secured on the support 75 the terminal surface 60 of the connector 50 electrically engages the voltage supply terminal 65 on the support 75. A first voltage supply 85 provides an electrical voltage to the voltage supply terminal 65 for operating the chuck 20. The electrical voltage flows through the connector 50 and the unidirectionally conducting coupler layer 70 to operate the electrode 30 of the electrostatic member. The first voltage supply 85 typically includes a circuit which comprises a high voltage DC source of about 1000 to 3000 volts, connected to a high voltage readout, through a 10 MΩ resistor. A 1 MΩ resistor in the circuit limits current flowing through the circuit, and a 500 pF capacitor is provided as an alternating current filter.

A second voltage supply 90 is connected to the electrically conducting portion of the support 75 in the process chamber 80. The electrically conducting portion of the support 75 functions as a process electrode, typically a cathode, for forming a plasma in the chamber 80. The second voltage supply 90 electrically biases the support 75 with respect to electrically grounded surfaces 95 in the chamber 80, which serve as an anode, to form a plasma from process gas introduced into the chamber 80. The second voltage supply 90, generally comprises an RF impedance that matches the impedance of the process chamber 80 to the impedance of the line voltage, in series with an isolation capacitor.

To operate the chuck 20, the process chamber 80 is evacuated and maintained at a predetermined, subatmospheric pressure. A substrate 45 is placed on the chuck 20, and the electrode 30 of the chuck 20 is electrically biased with respect to the substrate 45 by a voltage or current supplied by the first voltage supply 85 thorough the connector 50 and unidirectionally conducting coupler layer 70. Thereafter, process gas is introduced into the chamber 80 via the gas inlet 82, and plasma is formed from the process gas by activating the second voltage supply 90. The voltage applied to the electrode 30 causes electrostatic charge to accumulate in the electrode 30 and the plasma in the chamber 80 provides electrically charged species having opposing polarity which accumulate in the substrate 45. The accumulated opposing electrostatic charge results in an attractive electrostatic force between the substrate 45 and the electrode 30 of the chuck 20, causing the substrate 45 to be electrostatically held to the chuck 20. To maintain the substrate 45 at uniform temperatures, a heat transfer gas source 100 is used to supply heat transfer gas to grooves 105 in the insulated holding surface 40 of the electrostatic member 25. The electrostatically held substrate 45 covers up and seals the grooves 105, reducing leakage of heat transfer gas from the grooves 105. The heat transfer gas in the grooves 105 removes heat from the substrate 45 and maintains the substrate 45 at constant temperatures during processing of the substrate. Typically, the grooves 105 are spaced apart, sized, and distributed so that heat transfer gas held in the grooves 105 can cool substantially the entire substrate 45. More typically the grooves 105 form a pattern of intersecting channels extending through the entire insulator layer 35 covering the electrode 30.

Figure 2:
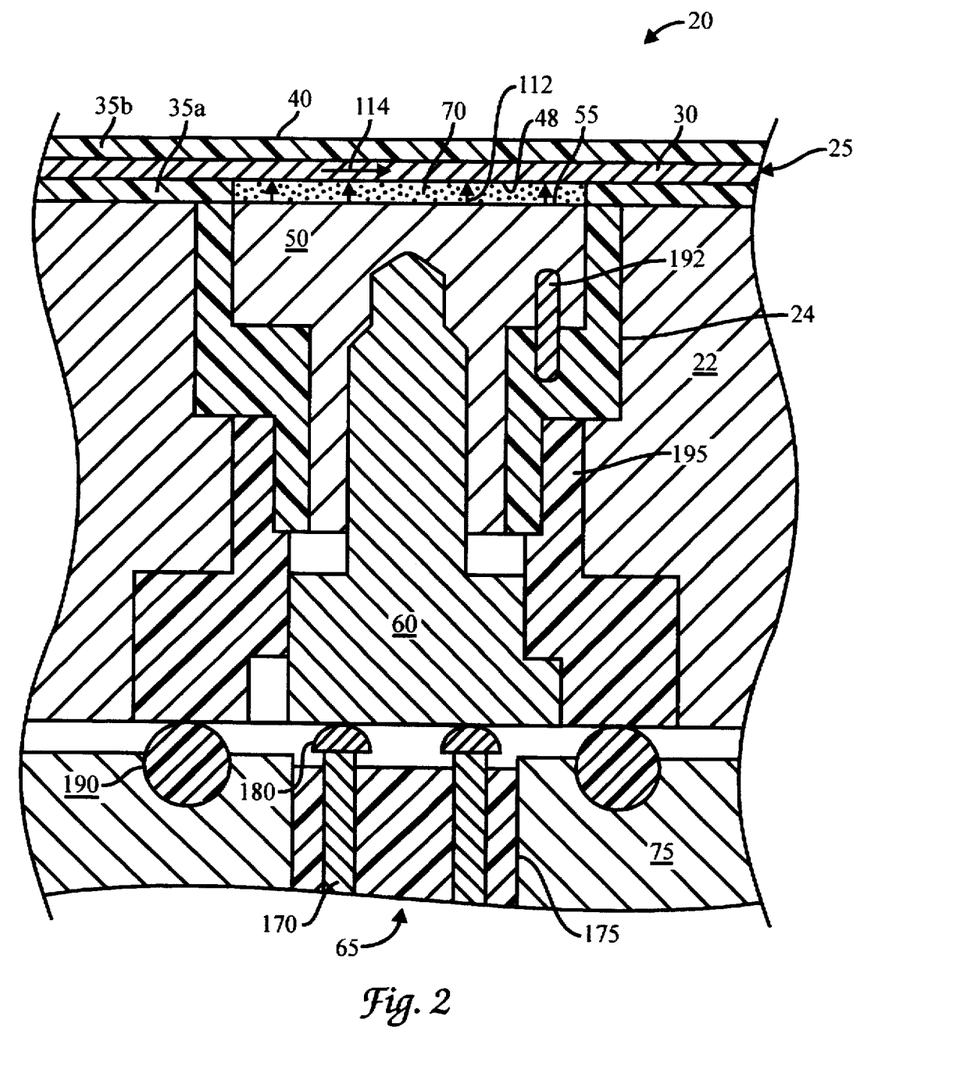
FIG. 2 is a detailed partial sectional view showing the electrical connection between an exposed contact surface of the electrode, the unidirectionally conducting coupler layer, and the voltage supply terminal.

With reference to FIG. 2, the electrode 30 of the chuck is powered by an electrical charge supplied through a voltage supply terminal 65 that is preferably located on the support 75 at the interface between the base 22 and the support 75. Typically, each voltage supply terminal 65 includes right circular pin members 170 disposed in a bore 175 through the support 75. The pin members 170 terminate in conductive terminal tips 180 which are preferably gold-plated copper. A high voltage lead (not shown) extends from the first voltage supply 85 to the pin members 170 to provide a voltage to the conductive terminal tips 180. The interface between the base 22 and the support 75 is sealed to prevent any heat transfer gas passing through the bore 24 of the base 22, from leaking into the process chamber 80. Sealing 0-rings 190 are disposed in the interface between the base 22 and the support 75, and positioned circumferentially about both the connector 50 and the bore 24 of the base 22. A dowel pin 192 prevents rotational movement of the connector 50. Polymer or elastomer bushings 195 surround the high voltage contact assembly to electrically isolate the high voltage contact assembly.

Figure 3:
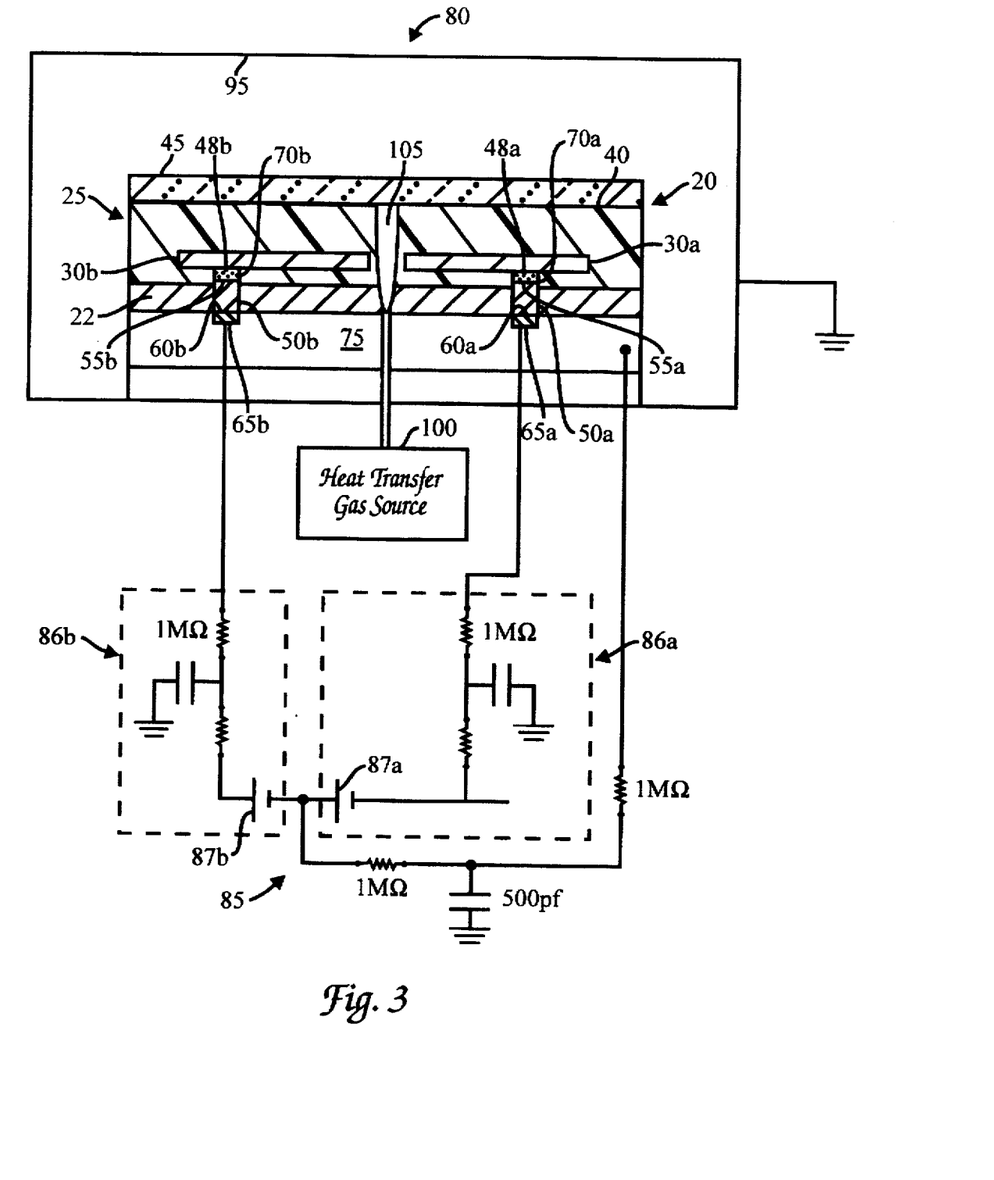
FIG. 3 is a partial sectional schematic view of a process chamber showing an embodiment of a bipolar electrostatic chuck according to the present invention.

Operation of a bipolar chuck 20 having an electrostatic member 25 with at least two electrodes 30a, 30b therein, is illustrated in the example shown in FIG. 3. Each electrode 30a, 30b comprises an exposed contact surface 48a, 48b, respectively, which exposes a portion of the electrode without insulator thereon. Two electrical connectors 50a, 50b each comprising junction surfaces 55a, 55b are used to electrically couple the exposed contact surfaces 48a, 48b of the electrodes to the junction surfaces 55a, 55b. Terminal surfaces 60a, 60b are used to electrically connecting the connectors to a voltage supply terminals 65a, 65b. Two unidirectionally conducting coupler layers 70a, 70b are bonded and electrically coupled to the contact surfaces 55a, 55b of the electrodes 30a, 30b. The voltage supply powering the bipolar electrodes in the chuck 20 can have several alternative configurations. In a preferred configuration, the voltage supply comprises (i) a first electrical circuit or voltage source 86a which typically includes a first DC power source 87a, and (ii) a second electrical circuit or voltage source 86b which includes a second DC power source 87b. The first and second power sources 87a, 87b, respectively, provide negative and positive voltages to the first and second electrodes to maintain the electrodes at negative and positive electric potentials. The opposing electric potentials of the electrodes 30a, 30b induce opposing electrostatic charges in the electrodes and in the substrate 45 held to the chuck 20 without use of a plasma in the process chamber 80, causing the substrate 45 to be electrostatically held to the chuck 20. Bipolar electrode configurations are advantageous for non-plasma processes in which there are no charged plasma species to serve as charge carriers for electrically biasing the substrate 45.

Referring to FIG. 2, features of the chuck 20 of the present invention which provide significant advantages over prior art chucks will now be described. The unidirectionally conducting coupler layer 70 of the chuck that is used to electrically couple the connector 50 to the electrode 30, provides a reliable high voltage contact without dissipation of the high voltage current to the surrounding base 22 of the chuck 20. The unidirectionally conducting coupler layer 70 comprises an anisotropic conductive material having a primary or high conductance axis, as illustrated by the arrows 112, substantially parallel to the longitudinal axis of the connector 50 in the straight line Z-axis direction from the terminal surface 60 to the junction surface 55 and substantially orthogonal or perpendicular to the exposed contact surface 48 of the electrostatic member. The coupler layer 70 further comprises a secondary, low conductance, or non-conducting plane parallel to the XY cross-sectional plane of the connector 60 (or parallel to the plane of the exposed contact surface of the electrode 30), as illustrated by the arrows 114. Preferably, the unidirectionally conducting coupler layer 70 comprises a first higher Z-axis conductivity of at least about 0.1 milliohm in the primary high conductance direction 112, and a second lower conductivity of at least about $1 \times 10^8$ milliohm along the low conductance XY plane. More preferably, the unidirectionally conducting coupler layer 70 comprises a first higher conductivity of from about 0.1 to about 50 milliohm in the primary Z-axis direction; and a second lower conductivity of from about $1 \times 10^8$ to about $1 \times 10^{12}$ milliohm in the XY low conductance plane.

The unidirectionally conducting coupler layer 70 comprises a current carrying capability sufficiently high to conduct the necessary current levels from the voltage supply terminal 65 to the electrode 30 of the chuck. Preferably, the unidirectionally conducting material comprises a current carrying capability of about 0.1 to about 100 amps, and more preferably from about 1 to about 50 amps. A dielectric breakdown strength of from about 1000 to about 5000 volts/mil is desirable to prevent sparking or arcing of high voltage currents. Preferably, the insulation resistance of the conducting layer should be greater than $10^{10}$ ohms. A dielectric constant of about 1 to about 20 and more typically 4 to 15 is also desirable. Generally, the permittivity of the unidirectionally conducting coupler layer 70 is determined by its electrical properties. In the presence of an electric field, the polarization vector, or the electric dipole moment per unit volume of the conducting layer 70 can result from induced dipole moments, alignment of permanent dipole moments, or migration of ionic charges. In the anisotropic conducting layer 70, the electric field vector is not parallel to electric displacement vector for charges. Thus, the conducting layer 70 is electrically anisotropic and is described by a permittivity tensor and a scalar permeability.

The unidirectionally conducting coupler layer 70 provides a secure, reliable, and high electrical conductance contact to directionally conduct high voltages and currents to the electrode 30. Because the unidirectionally conducting coupler layer 70 comprises an anisotropic conductive material having a primary or high conductance axis 112 in the Z-direction which is substantially parallel to the longitudinal axis of the connector 50, and a secondary low conductance plane 114 in the XY plane parallel to the cross-sectional plane of the connector 60, dissipation of the electrical current through the surrounding conducting portions of the chuck 20 is minimized or substantially entirely eliminated. The unidirectionally conducting coupler layer 70 can also form a part of the connector 50, for example, a top layer of the connector, or the entire connector 50 can be fabricated entirely from the unidirectionally conducting material.

In a preferred version, the unidirectionally conducting coupler layer 70 comprises a bonding adhesive that is capable of bonding the junction surface 55 of the connector 50 directly to the exposed contact surface 48 of the electrode 30. This allows the connector 50 to form a direct electrical contact with the electrode 30 via the unidirectional conducting coupler layer 70 to allow passage of electrical current without the need for spring loading and pressing the connector 50 directly against the surface of the electrode 30 without intervening layers. The resultant assembly reduces wear and damage of the relatively thin electrode layers. Also, the reduced force applied on the electrode 30 reduces or eliminates delamination or tearing of the electrostatic member 25, increasing the useful lifetime of the chuck. A suitable unidirectional electrically conducting adhesive comprises Z-LINK (TM) commercially available from Sheldhal, Northfield, Minn. Preferably, the directionally conducting adhesive has a peel strength of 0.1 to 50 lb in, and more typically from about 1 to 10 lb. in.

The high voltage contact assembly can be fabricated in a single pressure-forming step by bonding the connector 50 to the electrode 30 via the adhesive bonding conducting layer 70. The electrostatic member 25 is formed by pressure laminating a metal electrode layer within polymeric insulator layers using a pressure forming process. In the pressure forming process, the adhesive-based unidirectionally conducting coupler layer 70 is also contacted against, and bonded to the junction surface 55 of the connector 50. This allows the entire contact assembly and electrostatic member to be fabricated in a single pressure-lamination process step, minimizing fabrication costs, and increasing the reliability of the electrical connections formed in the electrostatic chucking system.

Particular components and aspects of the chuck 20 will now be discussed. The base 22 of the chuck 20, commonly known as the pedestal, is provided for supporting the electrostatic member 25, and typically is shaped and sized to correspond to the shape and size of the substrate 45 to maximize heat transfer and provide a wide holding surface. For example, if the substrate 45 is disk shaped, a right cylindrically shaped base 22 is preferred. Typically, the base 22 is of aluminum and has a cylindrical shape with a diameter of about 100 mm to 325 mm, and a thickness of about 1.5 cm to 2 cm. The top and bottom surfaces of the plate are ground using conventional grinding techniques, until the surface roughness of the plate is less than 1 micron, so that the base 22 can uniformly contact the support 75 and the substrate 45, to allow efficient thermal transfer between the substrate 45 and the support 75. After grinding, the plate is thoroughly cleaned to remove grinding debris. The base 22 has one or more bores 24 formed therethrough, the number of bores corresponding to the number of desired electrical connections to the electrodes in the electrostatic member 25. The bores 24 are sized sufficiently large to insert the connectors 50 therethrough with minimal or substantially no clearance. Preferably, the bores 24 are sized small that when the connector 50 is within the bore 24 substantially no heat transfer gas leaks from the bores, a suitable clearance being less than about 125 microns (5 mils), and more preferably less than about 5000 microns (20 mils).

The electrostatic member 25 comprises an insulator 35 with one or more electrodes 30 therein. The insulator 35 typically comprises an electrically insulator polymeric material, such as polyimide, polyketone, polyetherketone, polysulfone, polycarbonate, polystyrene, nylon, polyvinylchloride, polypropylene, polyetherketones, polyethersulfone, polyethylene terephthalate, fluoroethylene propylene copolymers, cellulose, tri-acetates, silicone, and rubber. The insulator 35 can also be formed from ceramic materials, such as aluminum oxide, aluminum nitride, boron carbide, boron nitride, diamond, silicon oxide, silicon carbide, silicon nitride, titanium oxide, titanium carbide, zirconium boride, zirconium carbide, and equivalents or mixtures thereof. The polymer and ceramic coatings can be formed using conventional fabrication methods.

Preferably, the insulator 35 is resistant to temperatures in excess of 50° C., and more preferably in excess of 100° C., so that the chuck 20 can be used for high temperature processes. Also, preferably, the insulator 35 has a high thermal conductivity so that heat generated in the substrate 45 during processing can dissipate through the chuck 20, a suitable thermal conductivity being at least about 0.10 Watts/m/°K. A high thermal conductivity particle filler can also be added to the insulator, the filler having an average particle size of less than about 10 μm, to increase the thermal conductivity and erosion resistance. Preferably, the volumetric ratio of the filler to insulator is from about 10% to 80%, and more typically from 20% to 50%. Additionally, a protective coating (not shown) can be applied on the holding surface 40 of the insulator 35 to reduce chemical degradation of the chuck 20 in corrosive processing environments.

The insulator 35 is sized sufficiently large to enclose the electrode 30 therein and sufficiently thick to electrically insulate the electrode 30. Typically, the insulator 35 has a resistivity ranging from about $10^{11}$ Ωcm to $10^{20}$ Ωcm, and a dielectric constant of at least about 2, and more preferably at least about 3. The overall thickness of the insulator 35 depends on the electrical resistivity and dielectric constant of the insulative material used to form the insulator 35. For example, when the insulator 35 has a dielectric constant of about 3.5, the thickness of the insulator 35 is typically about 10 μm to about 500 μm thick, and more preferably from about 100 μm to about 300 μm thick. Polyimide insulative materials have dielectric breakdown strengths of typically at least about 3.9 volts/mil (100 volts/micron), and more typically at least about 39 volts/mil (1000 volts/micron).

The insulator 35 of the electrostatic member 25 forms the insulated holding surface 40 on the electrode, and a portion of the insulator 35 below the electrode is stripped off to form the exposed contact surface 48 of the electrostatic member. Typically, the insulator 35 comprises a two layer laminate structure, as illustrated in FIG. 2, comprising a lower insulator layer 35a and an upper insulator layer 35b, between which the electrode is embedded. Preferably, the insulator layers 35a, 35b have substantially equivalent thicknesses of from about 50 μm to about 100 μm thick. The lower insulator layer 35a comprises an opening that exposes a portion of the electrode 50 to form the exposed contact surface 48. The opening of the lower insulator layer 35a is sized sufficiently large to insert the junction surface 55 of the connector 50 therethrough with minimal clearance. The exposed contact surface 48 of the electrode 30 preferably has an area of about 50 to about 400 sq. mm, and more preferably from about 75 to about 150 sq. mm. The upper insulator layer 35b covers and encloses the electrode 30 to form the insulated holding surface 40 for receiving a substrate 45 thereon.

The laminate insulator 35 comprises one or more electrodes 30 therein. Both the monopolar electrode 30 and bipolar electrodes 30a, 30b are made from an electrically conducting material, such as for example, metals such as copper, nickel, chromium, aluminum, iron, and alloys thereof. The shape and size of the electrodes 30 varies according to the size and shape of the substrate 45. For example, as shown in the drawings, if the substrate 45 is disk shaped, the electrode is also disk shaped to maximize the area of the electrode in contact with the substrate 45. Preferably, the electrodes 30 cover substantially the entire area in the insulator 35, the total area of the electrodes being typically from about 50 to about 500 sq. cm., and more typically from 80 to 380 sq. cm. For the bipolar electrode configurations, the area of each of the electrodes 30a, 30b is substantially equivalent and typically comprises about one-half of the total area of the top surface of the chuck 20. Thus, the area of each electrode is from about 50 to about 250 sq.

cm., and more preferably from 100 to 200 sq. cm. Typically, the thickness of the electrodes 30 is from about 1 µm to 100 µm, and more typically from about 1 µm to 50 µm. However, in certain electrode configurations, it is advantageous to utilize thinner electrodes in order to effectively seal the tips of the heat transfer gas grooves 105 which extend to the peripheral edge 110 of the insulator 35, as disclosed in U.S. patent application Ser. No. 08/369,237, entitled "EROSION RESISTANT ELECTROSTATIC CHUCK WITH IMPROVED COOLING SYSTEM," filed on Jan. 6, 1995, by Cameron, et al., which is incorporated herein by reference.

The monopolar electrode 30 and bipolar electrodes 130, 135 can either be continuous or patterned with interconnected features sized so that heat transfer gas grooves 105 formed therebetween are used to hold a heat transfer gas for heating or cooling the substrate 45 held on the chuck 20. The bipolar electrodes 30a, 30b can comprise a ring electrode configuration (not shown) having inner electrode rings surrounded by outer electrode rings with an electrical isolation void therebetween. Typically, the bipolar electrodes 30a, 30b are coplanar and have substantially equivalent areas so that the electrodes generate equivalent electrostatic clamping forces on the substrate 45. In another configuration, the bipolar electrodes comprises two semicircular electrodes (not shown) separated by a radially extending electrical isolation void. Suitable bipolar electrode configurations are described in aforementioned U.S. patent application Ser. No. 08/410,449.

A single electrical connector 50 is used to electrically connect the monopolar electrode 30 to the first voltage supply 85. Separate connectors are used to separately electrically connect each of the bipolar electrodes 30a, 30b to the first voltage supply 85. For both types of electrodes, the electrical connectors are substantially identical and to avoid repetition will only be described once. The connector 50 can be fabricated from an electrically conducting metal such as copper or aluminum. The connector 50 is sufficiently long to electrically connect the electrode 30 to the voltage supply terminal 65. Typically, the length and width of the connector 50 are each from about 1 mm to about 20 mm. The connector 50 includes a junction surface 55 suitable for electrical connection to the exposed contact surface 48 of the electrode 30 via the unidirectionally conducting coupler layer 70. The connector 50 also includes a terminal surface 60 for electrically engaging the voltage supply terminal 65. The terminal surface 60 of the connector 50 is shaped and sized sufficiently large to directly electrically engage the voltage supply terminal 65 on the support 75, without causing arcing of the high voltage passing therethrough. Preferably, the area of the terminal surface 60 is at least about the area of the high voltage terminal 65, and more preferably substantially equivalent to the area of the high voltage terminal 65. The area of the terminal surface 60 is typically from about 50 to about 400 sq. mm. A disk or rectangular cross-sectional terminal surface 60, having a radius ranging from 5 to 12 mm, provides a sufficient contact area.

A method of manufacturing the electrostatic member 25 will now be described. Preferably, the electrostatic member is fabricated as a laminate comprising two or more layers of insulator 35a, 35b with the monopolar electrode 30 or the bipolar electrodes 30a, 30b therein. The laminate can be fabricated from a multi-layer film comprising an insulator layer and an electrically conductive layer, such as "R/FLEX 1100" film commercially available from Rogers Corporation, Chandler, Ariz., which comprises an electrically conductive copper layer on a 25 to 125 µm thick polyimide insulator layer. The copper layer of the multi-layer film is etched, routed, or milled to form the electrode 30. An etching process suitable for forming the electrode 30 or electrodes 30a, 30b, comprises the steps of (i) forming a protective resist layer patterned to correspond to the shape of the electrodes 30 over the electrically conductive layer of the multi-layer film, and (ii) etching the resist protected multi-layer film using conventional etching processes. The resist layer can be formed using photoresist materials, such as "RISTON" fabricated by DuPont de Nemours Chemical Co., Wilmington, Del., applied on the electrode layer. Conventional photolithographic methods, such as those described in *Silicon Processing for the VLSI Era*, Volume 1: *Process Technology*, Chapters 12, 13, and 14, by Stanley Wolf and Richard N. Tauber, Lattice Press, California (1986), which is incorporated herein by reference, can be used to pattern the resist layer on the electrically conductive layer. Conventional wet or dry chemical etching methods can be used to etch the multi-layer film, as described in *Silicon Processing*, Chapter 16, supra, which is incorporated herein by reference. A suitable wet chemical etching method comprises immersing the multi-layer film into an etchant such as ferric chloride, sodium persulfate, or an acid or base, until the unprotected portion of the electrode layer is etched.

After etching the electrically conductive layer to form the electrodes 30, a second insulator film is adhered over the conductive layer so that the conductive layer is embedded within the top insulator films to form the laminated electrostatic member 25. An opening is formed in the second insulator film to expose a portion of the conductive layer to form the exposed contact surface 48. Suitable insulator films include, for example, "KAPTON," a polyamide film manufactured by DuPont de Nemours Co., in Wilmington, Del.; "APIQUEO" fabricated by Kanegafuchi Chemical Indus., Japan; "UPILEX" manufactured by Ube Indus. Ltd., Japan; "NITOMID" fabricated by Nitto Electric Indus. Co. Ltd., Japan; and "SUPERIOR FILM" fabricated by Mitsubishi Plastics Indus. Ltd., Japan. Methods of fabricating the insulator laminate structure are generally described in aforementioned U.S. patent application Ser. No. 08/199,916.

Figure 4:
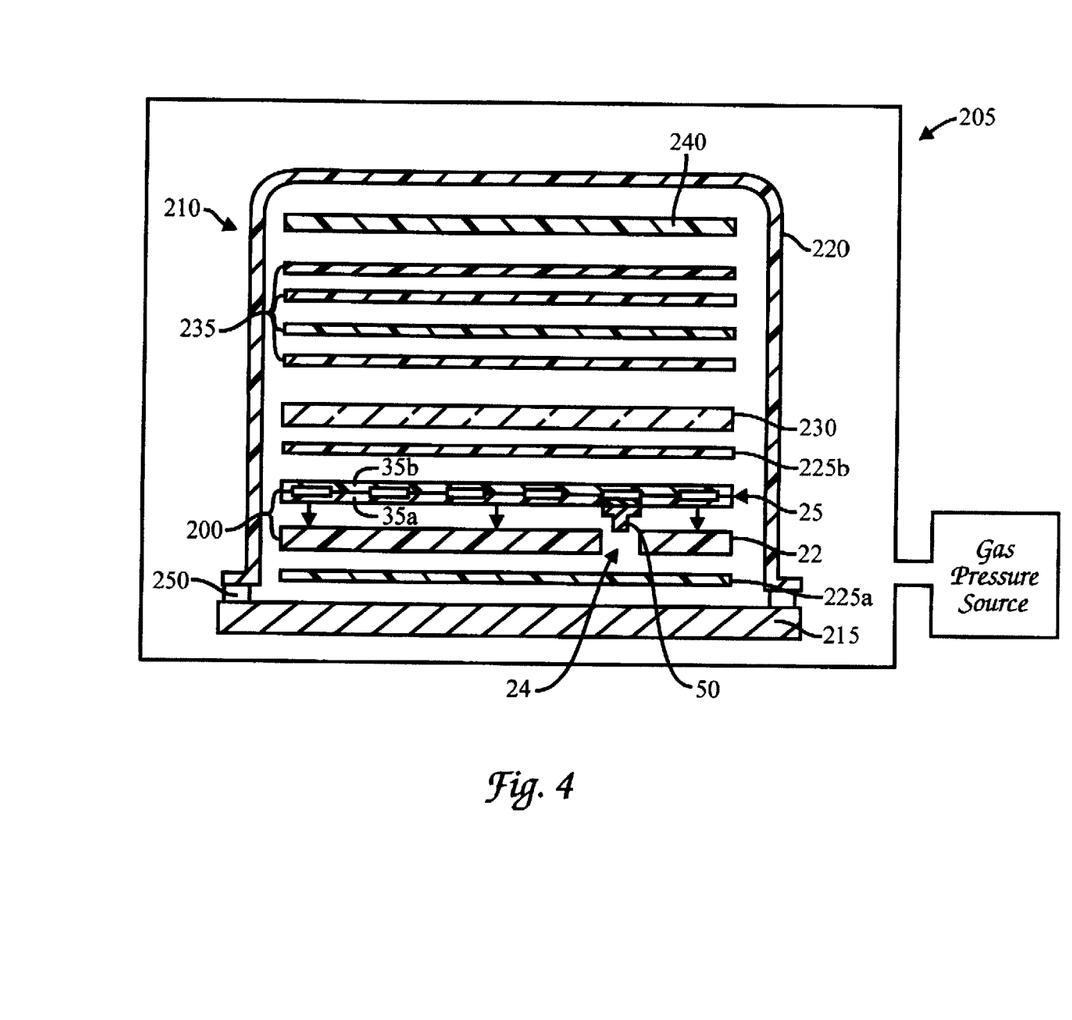
FIG. 4 is a schematic sectional side view of a vacuum bag lay-up used to fabricate an electrostatic chuck in a pressure forming apparatus.

With reference to FIG. 4, a pressure forming process is used to adhere and bond the various layers of the electrostatic member 25 to one another, and simultaneously bond the connector 50 to the unidirectional conducting layer 30. Prior to bonding, the exposed contact surface 48 of the electrode and the junction surface 55 of the connector, both of which are to be bonded to the unidirectionally conducting coupler layer 70, are etched cleaned using a sodium persulfate etch for about 30 to 45 seconds at 95° F., and thereafter rinsed in water. The various insulator and electrode layers are placed on a base 80. A disc shaped pad of unidirectional conducting material, such as the aforedescribed Z-LINK bonding material is cut and positioned from the back of the base 80 onto the exposed contact surface 48 of the electrode 30. A pre-fabricated connector 50 is then inserted through the bore 24 in the base 22. The junction surface 55 of the connector 50 rests upon the unidirectionally conducting layer 70 and the terminal surface 60 of the connector 50 is exposed through the base 22, to form a base-film assembly 200, as shown in FIG. 4.

The base film assembly 200 is pre-baked to a temperature of about 250° F. for about 2 hours in a nitrogen atmosphere to remove residual moisture. The base-film assembly 200 is then placed in a pressure forming apparatus 205 which is maintained at a pressure sufficiently high to force the insulator layers 35a, 35b to bond to one another and to bond the unidirectionally conducting layer 70 to the connector 50.

Typically, the pressure forming apparatus 205 is maintained at a pressure of about 500 to 30,000 Torr (10 to about 500 psi), and more typically about 10,000 to 30,000 Torr (200 to 500 psi). When the insulator layers 35a, 35b are adhered to the base 22 using a pressure sensitive adhesive, lower pressures are preferred to avoid excessive squeezing out of the adhesive, the pressures typically ranging from about 500 to about 13,000 Torr (10 to 25 psi). Preferably, a stainless steel plate having a roughness less than about 0.2 to 0.3 microns RMS, is positioned on the insulator layers 35a, 35b to apply a uniform and constant pressure on the laminate to provide a flat holding surface 40. Conventional pressure forming processes are generally described in Allen J. Kling, *Curing Techniques for Composites, Advanced Composites*, April, 1985, which is incorporated herein by reference.

Preferably, simultaneously with pressurization, the base-film assembly 200 is heated to a temperature sufficiently high to cause the insulator film layers 35a, 35b to become malleable and adhere to the electrode 30, and to adhere the unidirectional conducting coupling layer 70 to the junction surface 55 of the connector 50. A typical heating cycle comprises (i) a temperature ramp up of about 12° F./min for about 15 minutes to allow outgassing of gaseous reactant byproducts from the insulator film, (ii) a temperature hold at the curing temperature of the insulator and unidirectionally conducting materials, typically from about 375° to 380° F. for about 50 to 60 minutes, and (iii) a temperature ramp down at about 12° F./min.

Suitable pressure forming apparatus 205 include autoclaves, platen presses or isostatic presses. Autoclaves are preferred because they apply a more uniform pressure on the base-film assembly 200. Typical autoclaves comprise pressure resistant steel chambers having diameters ranging from about 1 to 10 feet. A pressurized nonreactive gases such as carbon dioxide or nitrogen is used to pressurize the autoclave. Suitable autoclaves include those fabricated by "BARON AUTOCLAVES," Santa Fe Springs, Calif.; "AOV INDUSTRIES" in Anaheim, Calif.; and "MELCO STEEL," in Azusa, Calif. Instead of using an autoclave, a platen press or isostatic press can also be used to conform the insulator 35a, 35b to the base 22. When a platen press is used, a pressure-distribution sheet such as a silicone or stainless steel plate is placed on the insulator 35a, 35b to uniformly distribute the platen pressure onto the base-film assembly 200. Isostatic presses are used by placing the base-film assembly 200 in a suitable isostatic molding bag, and applying a sufficient pressure on the bag using the isostatic press.

Simultaneously with applying a pressure on the base-film assembly 200, it is preferred to evacuate and remove air trapped between the insulator layers 35a, 35b and the base 80, using a vacuum bag assembly 210, as shown in FIG. 4. It is also desirable to remove trapped air to prevent oxidation of the metal electrode 30. The vacuum bag assembly 210 typically comprises a stainless steel base plate 215 which can be sealed using a flexible bagging material 220. The bagging material 220 is typically made from nylon or silicone and is from about 25 to 100 μm thick. Vacuum bags manufactured by AIRTECH International Inc., Carson, Calif.; Bond Line Products, Norwalk, Calif.; and Zip-Vac, in Auburn, Wash., are suitable. To use the vacuum bag 220, the base-film assembly 205 is placed within the bag, and layers of fabric and release film are stacked on the base-film assembly to form a vacuum bag assembly which allows gaseous reactant byproducts to be vented and also allows the base-film assembly to be easily separated from the vacuum bag. A suitable series of fabrics and release films 225a, 225b, as shown in FIG. 4, includes: (i) release films such as "TEFLON" fabricated by DuPont de Nemours Company, Wilmington, Del., and the "A4000P" release film fabricated by Airtech, Carson, Calif., placed on either side of the base-film assembly 200; (ii) a pressure-distribution conformed sheet 230 such as a thermoplastic silicone sheet is placed over the upper release film 225b; (iii) a stack of porous bleeder fabrics 235 such as the "AIRWEAVE FR EDGE BLEED," both fabricated by Airtech, Carson, Calif., are placed on the conformer sheet 230 to promote evacuation of the vacuum bag 210 and to remove condensates formed in the process; and (iv) breather sheets 240 such as "AIRWEAVE SS RESIN ABSORBER" or "A22C" fabricated by Airtech, Carson, Calif., placed over the bleeder fabric 235 to provide uniform vacuum pressure around the bag 210. A tacky sealant tape 250 is used to seal the vacuum bag 210. The sealed vacuum bag 210 is evacuated via a vacuum connector line connected to a vacuum system, the vacuum line passing through the bag and terminating near the breather sheets 240, to a pressure less than about 25 inches of mercury.

The electrostatic chuck 20 having features of the present invention has several advantages. The unidirectionally conducting coupler layer 70 that electrically couples the connector 50 to the electrode 30, provides an anisotropic conducting material having a high conductance parallel to the longitudinal axis of the connector 50, and a low conductance parallel to the cross-sectional plane of the connector 60. This provides a reliable and highly directional high voltage contact that exhibits reduced dissipation of the high voltage current to the surrounding base 22 of the chuck 20. The unidirectionally conducting coupler layer 70 further provides a high current carrying capability that conducts the necessary current from the voltage supply terminal 65 to the electrode 30 of the chuck. Furthermore, bonding of the connector 50 directly to the electrode 30 provides a reliable and direct high voltage contact without the need for spring loading or pressing the connector 50 against the electrode 30. As such, advantageously the connector 50 does not damage the electrode or reduce the structural integrity of the elctrostatic member 25. Further, the connector assembly is substantially resistant to erosion by the erosive environment in the process chamber 80 because the connector is passed through the base 22 and is covered and protected by the substrate 45 held on the chuck 20.

Although the present invention has been described in considerable detail with reference to certain preferred versions, many other versions should be apparent to those skilled in the art. Therefore, the spirit and scope of the appended claims should not be limited to the description of the preferred versions contained herein.

What is claimed is:

1. An electrostatic chuck for holding a substrate in a process chamber having a voltage supply terminal for charging the chuck, the electrostatic chuck comprising:
    (a) an electrostatic member including (i) an electrode, (ii) an electrically insulated holding surface, and (iii) an electrical contact surface for conducting charge to the electrode; and
    (b) a unidirectionally conducting coupling layer bonded to the contact surface to conduct a charge in substantially only a single direction from the voltage supply terminal to the contact surface to charge the electrode.

2. The electrostatic chuck of claim 1, wherein the unidirectionally conducting coupler layer comprises an anisotropic conducting layer having a primary conduction axis substantially orthogonal to the contact surface of the electrode.

3. The electrostatic chuck of claim 2, wherein the unidirectionally conducting coupler layer comprises a first conductivity of at least about 0.1 milliohm in the direction substantially perpendicular to the contact surface of the electrode, and a second conductivity of at least about $1\times10^8$ milliohm in the plane parallel to the contact surface of the electrode.

4. The electrostatic chuck of claim 1, wherein the unidirectionally conducting coupler layer comprises a current carrying capacity of at least about 25 amps.

5. The electrostatic chuck of claim 1, further comprising a connector having (i) a junction surface bonded to the unidirectionally conducting coupler layer, and (ii) a terminal surface for electrically coupling to the voltage supply terminal in the process chamber.

6. The electrostatic chuck of claim 5, wherein the unidirectionally conducting coupler layer comprises adhesive for bonding the contact surface of the electrode to the junction surface of the connector.

7. The electrostatic chuck of claim 5, further comprising a base for supporting the electrostatic member, the base having an opening for the connector to extend therethrough.

8. The electrostatic chuck of claim 1, wherein the electrostatic member comprises a plurality of electrodes each having at least one contact surface.

9. A method of fabricating an electrostatic chuck for holding a substrate in a process chamber having a voltage supply terminal for charging the chuck, the method comprising the steps of:

(a) forming an electrode having an electrically insulated holding surface and an electrical contact surface; and (b) bonding a unidirectionally conducting coupler layer to the contact surface to conduct a charge in substantially only a single direction from the voltage supply terminal to the contact surface to charge the electrode.

10. The method of claim 9, wherein in step (b) comprises applying an anisotropic conducting layer to the contact surface of the electrode, the anisotropic conducting layer having a primary conduction axis substantially orthogonal to the contact surface of the electrode.

11. The method of claim 9, wherein in step (b) the unidirectionally conducting coupler layer comprises a first conductivity of at least about 0.1 milliohm in the direction substantially orthogonal to the contact surface of the electrode, and a second conductivity of at least about $1\times10^8$ milliohm parallel to the plane of the contact surface.

12. The method of claim 9, wherein step (b) includes the step of bonding a junction surface of a connector to the contact surface of the electrode.

13. The method of claim 9 wherein step (b) comprises the steps of:

(i) applying a layer of unidirectional-conducting material on the contact surface of the electrode;

(ii) positioning a junction surface of a connector on the unidirectional-conducting layer; and (iii) applying a pressure on the unidirectional-conducting material and heating the material to a temperature sufficiently high to bond the unidirectional-conducting material to both the contact surface of the electrode and the junction surface of the connector.

14. The method of claim 9, wherein step (a) comprises the steps of (i) forming a laminate insulator having an electrode embedded therein, and (ii) stripping off a portion of the laminate insulator to expose a portion of the electrode to form the contact surface.

* * * * *